(12) United States Patent
Grosz et al.

(10) Patent No.: US 10,990,319 B2
(45) Date of Patent: Apr. 27, 2021

(54) ADAPTIVE WATCHDOG IN A MEMORY DEVICE

(71) Applicant: Micron Technology, Inc., Boise, ID (US)

(72) Inventors: Nadav Grosz, Broomfield, CO (US); David Aaron Palmer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 214 days.

(21) Appl. No.: 16/010,940

(22) Filed: Jun. 18, 2018

(65) Prior Publication Data
US 2019/0384528 A1 Dec. 19, 2019

(51) Int. Cl.
| | | |
|---|---|---|
| *G06F 3/06* | (2006.01) | |
| *G06F 11/07* | (2006.01) | |
| *G06F 11/10* | (2006.01) | |
| *G11C 29/52* | (2006.01) | |

(52) U.S. Cl.
CPC .......... *G06F 3/0659* (2013.01); *G06F 3/0611* (2013.01); *G06F 3/0653* (2013.01); *G06F 3/0679* (2013.01); *G06F 11/073* (2013.01); *G06F 11/0757* (2013.01); *G06F 11/1068* (2013.01); *G11C 29/52* (2013.01)

(58) Field of Classification Search
CPC .... G06F 3/0611; G06F 3/0653; G06F 3/0659; G06F 3/0679; G06F 11/073; G06F 11/0757; G06F 11/1068; G11C 29/021; G11C 29/52
See application file for complete search history.

(56) References Cited

U.S. PATENT DOCUMENTS

| | | | | |
|---|---|---|---|---|
| 6,048,075 | A | * | 4/2000 | Lai .......................... F21V 29/83 362/240 |
| 2005/0114732 | A1 | | 5/2005 | Janin et al. |
| 2005/0235100 | A1 | * | 10/2005 | Sakurai ............... G06F 13/1636 711/106 |
| 2005/0276114 | A1 | | 12/2005 | Tsunekazu et al. |
| 2005/0281099 | A1 | | 12/2005 | Lovett |
| 2006/0053349 | A1 | | 3/2006 | Ozawa |
| 2015/0295560 | A1 | | 10/2015 | Pal et al. |
| 2016/0155491 | A1 | * | 6/2016 | Roberts ............. G11C 11/40607 711/106 |

FOREIGN PATENT DOCUMENTS

| | | | | |
|---|---|---|---|---|
| JP | 2005-165415 | * | 6/2005 | .............. G06F 11/22 |

OTHER PUBLICATIONS

"International Application Serial No. PCT US2019 037298, International Search Report dated Oct. 2, 2019", 3 pgs.
"International Application Serial No. PCT US2019 037298, Written Opinion dated Oct. 2, 2019", 5 pgs.

* cited by examiner

*Primary Examiner* — Larry T Mackall
(74) *Attorney, Agent, or Firm* — Schwegman Lundberg & Woessner, P.A.

(57) ABSTRACT

Devices and techniques for an adjustable watchdog in a memory device are disclosed herein. A memory operation command is received at a first time with a memory device from a host. A reset signal is received, with the memory device from the host, at a second time following the first time. A time interval between the first time and the second time is measured. A delay interval for a timer in the memory device to reset the memory device independently of receiving a further reset signal from the host is established based on the measured time interval.

18 Claims, 6 Drawing Sheets

ADAPTIVE WATCHDOG IN A MEMORY DEVICE

BACKGROUND

Memory devices are typically provided as internal, semiconductor, integrated circuits in computers or other electronic devices. There are many different types of memory, including volatile and non-volatile memory. Flash memory is utilized as non-volatile memory for a wide range of electronic applications. Flash memory devices typically include one or more groups of floating gate, or charge trap memory cells that allow for high memory densities, high reliability, and low power consumption.

Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line. Word lines coupled to the gates of the unselected memory cells of each group are driven at a specified pass voltage (e.g., Vpass) to operate the unselected memory cells of each group as pass transistors (e.g., to pass current in a manner that is unrestricted by their stored data values).

Memory arrays or devices can be combined together to form a storage volume of a memory system, such as a solid-state drive (SSD), a Universal Flash Storage (UFS™) device, a MultiMediaCard (MMC) solid-state storage device, an embedded MMC device (eMMC™), and the like. An SSD can be used as, among other things, the main storage device of a computer or mobile device (e.g., a smartphone), having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells, to obviate internal battery supply requirements, thus allowing the drive to be more versatile and compact.

Many conventional memory devices typically include a watchdog timer that resets the memory device after a preset fixed period of time to avoid deadlock or crash conditions, and to thereby improve reliability of the memory devices. A host associated with the memory devices may, in some cases, reset the memory devices when a given command issued by the host times out or exceeds a host timeout value. Such conventional memory watchdog timers typically operate based on fixed intervals, which may offer less than ideal performance in the contexts of different systems into which the memory devices are incorporated.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

This document addresses various techniques for configuring and operating a memory watchdog timer to establish a timer value (timeout value) of an adaptive watchdog module in, or associated with, one or more memory devices in response to operations of the system into which the memory is incorporated. This document discusses various techniques for monitoring host timeout events (e.g., when a host resets the memory device) relative to receipt of memory operation commands to identify a lower (or lowest or smallest) possible timeout value for the adaptive watchdog module (e.g., a timer value that is a threshold amount smaller than the host timeout interval). This document discusses various techniques for monitoring memory latencies in performing or executing one or more memory operation commands to identify a lower (or lowest or smallest) possible timeout value for the adaptive watchdog module (e.g., a timer value that is a threshold amount greater than the largest memory operation latency). As referred to herein, memory devices may include the memory array cells, bus lines including latches of the bus, memory controllers, dies on which the memory array and other memory components are implemented, and any other component used to store or retrieve information or that assists a storage element to perform storage or retrieval operations.

The adaptive watchdog module(s) may be external and/or outside of a memory device, memory device die, or may be included on the memory device die, or, for example on a logic die physically associated with the memory die. In some cases, there may be a separate adaptive watchdog module for each memory device or, in some examples, each portion of a memory device on a given die. The adaptive watchdog module may be configured to trigger a reset signal to one or more memory devices when the adaptive watchdog module timer times out (reaches a given adaptive watchdog module timer value). This results in the memory device being reset independently (or without involvement) of the host issuing a reset signal.

In some implementations, a single adaptive watchdog module may be coupled to multiple memory devices and may implement multiple watchdog timers (each having a different value) for the various memory devices. For example, one memory device may be dedicated to performing a given set of operations for one application or type of application (e.g., an image processing application) or may be configured to communicate with one host processor (e.g., one core of a multi-core processor) and a second memory device may be dedicated to performing a given set of operations for a second application or type of application (e.g., an email application) or may be configured to communicate with a second host processor (e.g., a second core of the multi-core processor). In such circumstances, the watchdog module may be configured with different timer values for each memory device. The below discussion pertains to adjusting or establishing the timer value for a given watchdog module and applies similarly to adjusting or establishing the timer value for multiple watchdog modules.

The adaptive watchdog module timeout value may be established when the given memory device or adaptive watchdog module is being manufactured or may be configured, changed, or adjusted after the memory device is manufactured. For example, the adaptive watchdog module may be initially set with a preset timer value corresponding to the specifications of the given memory device (e.g., a safe amount of time allowing for worst case latency conditions of the memory device or average latency of the memory device). During operations of the memory device, the adaptive watchdog module may monitor interactions within the memory device and between the memory device and an external component (e.g., a processor) to dynamically adjust the adaptive watchdog module timer value.

In some implementations, the adaptive watchdog module may receive a signal representative of the memory device receiving a memory device operation command from a host (a processor coupled to the memory device). The adaptive watchdog module may store a timestamp for the received memory device operation command. Alternatively, the adaptive watchdog module may access a memory queue in which the memory device operation command is stored along with a respective timestamp. The timestamp of the memory device operation command may identify the time at which the memory device operation command was received from the host. After the memory device operation command is successfully executed by the memory device, the memory device may reset the timer of the adaptive watchdog module.

In some cases, the memory device operation command may not finish executing or be successfully performed before a reset signal is received from the host. For example, the host may associate a timer with a host timeout value for each command issued by the host to the memory device and if the given command is not successfully performed by the memory device before the timeout value of the host (e.g., before the host times out), the host may send a reset signal to the memory device. In such circumstances, the adaptive watchdog module may generate a timestamp representing the time at which the memory device received the reset signal from the host (e.g., due to the host timeout event). The adaptive watchdog module may retrieve the timestamp of the memory device operation command that was first or last received from the host before the host timed out. The adaptive watchdog module may compute a difference between the timestamp of the memory device operation command and the timestamp of the host timeout reset signal to determine a time interval that estimates the host timeout event period (e.g., the host timeout timer). The adaptive watchdog module may set the adaptive watchdog module timer value to the determined time interval minus a threshold amount (e.g., a delta value). The time interval minus the threshold amount may be referred to as the adjusted time interval or the adjusted estimated host timeout value. The threshold amount may be a predefined unit of time or may be a percentage value of the timer value to be adjusted. For example, the threshold amount may be set to a given percentage value (e.g., 1 percent) and in such circumstances, setting the determined time interval minus a threshold may correspond to setting the timer value to 99% of the determined time interval (i.e., the determined time interval minus 1 percent of the determined time interval).

As a result, the adaptive watchdog module may self-reset the memory device when subsequently received memory operation commands from the host approach the host timeout value. Namely, the adaptive watchdog module may reset the memory device before the host times out. In some cases, when the adaptive watchdog module resets the memory device, the memory device or the adaptive watchdog module may inform the host about the watchdog initiated reset to reset the host timeout timer and avoid having the host also send a reset signal upon timing out. The term "times out," "timeout," or "timing out" should be understood to refer to a running timer reaching a preset value or amount. The threshold amount may be predefined based on a characteristic of the host (e.g., type of processor, or type or number of applications running on the host).

In some implementations, the adaptive watchdog module may track how long the memory device takes to perform a memory operation and may set the adaptive watchdog module timer value to the longest amount of time plus a threshold amount (e.g., a delta value). The threshold amount may be the same or different from the threshold amount used above in subtracting from the estimated host timeout value. The threshold amount may be predefined based on a characteristic of the host (e.g., type of processor, or type or number of applications running on the host). The threshold amount may be a predefined unit of time or may be a percentage value of the timer value to be adjusted. For example, the threshold amount may be set to a given percentage value (e.g., 1 percent) and in such circumstances, setting the timer value to the longest amount of time plus a threshold may correspond to setting the timer value to 101% of the longest amount of time (i.e., the longest amount of time plus 1 percent of the longest amount of time).

For example, the adaptive watchdog module may generate or obtain a timestamp for a given memory device operation received from the host. After the memory device operation completes, the adaptive watchdog module may generate another timestamp and, based on a difference between the timestamp of when the command was received and when the command completed, the adaptive watchdog module may determine a command latency. The adaptive watchdog module may generate latency values for a threshold number of memory device operation commands. After the threshold number of memory device operation commands are performed, the adaptive watchdog module may retrieve the generated latency values and compute an average of such values to determine a memory latency period. Alternatively, the adaptive watchdog module may identify a maximum of all the generated latency values and determine the memory latency period as the identified maximum latency value. The adaptive watchdog module may set the adaptive watchdog module timer value to the determined memory latency plus a threshold amount (e.g., a delta value). The determined memory latency plus the threshold amount may be referred to as the adjusted memory latency. As a result, the adaptive watchdog module may self-reset the memory device when subsequently received memory operation commands are not completed before the longest or average latency period of previous commands issued to the memory device.

In some implementations, the adaptive watchdog module may determine different memory latencies for different classes of memory operations. For example, the adaptive watchdog module may determine a first memory latency representing a maximum or average latency of performing write operations. Similarly, the adaptive watchdog module may determine a second memory latency representing a maximum or average latency of performing read operations. In particular, one class of commands may correspond to single read operations, another class of commands may correspond to block read operations, another class of commands may correspond to single write operations, another class of commands may correspond to block write operations, another class may correspond to block erase or single erase, another class may correspond to a set of write operations received within a given interval (e.g., a frequency of one or more types of commands). The adaptive watchdog module may set priorities to the different classes of commands and may base the adjustment of the adaptive watchdog module timer value on the latency (as adjusted by the threshold amount) of the class of command with the highest priority. For example, the adaptive watchdog module may determine that write commands have a higher priority than read commands. In such circumstances, the adaptive watchdog module may retrieve the first memory latency value instead of the second memory latency value and adjust the first memory latency value by adding the threshold amount to the first memory latency value to set the watchdog timer value to the adjusted first memory latency value. In some implementations, the adaptive watchdog module may identify the class of commands having the most activity for a given application being executed by the host. In such circumstances, the adaptive watchdog module may increment the priority associated with that identified class of commands. As such, a given application that performs more operations of a first class than a second class may influence or cause the adaptive watchdog module to adjust the adaptive watchdog module timer value based on the first class of commands latency rather than the second class of commands latency.

In some implementations, the adaptive watchdog module may compare the adjusted estimated host timeout value (e.g., the time between receipt of a memory operation and receipt of a host reset minus the threshold amount) to the adjusted memory latency (e.g., the average or maximum amount of time between receipt of a memory operation and completion of the memory operation plus the threshold amount). The adaptive watchdog module may set the watchdog timer value to the minimum of the two periods. In particular, if the adjusted estimated host timeout value is greater than the adjusted memory latency, the adaptive watchdog module may set the watchdog timer to be the adjusted memory latency. If the adjusted estimated host timeout value is less than or equal to the adjusted memory latency, the adaptive watchdog module may set the watchdog timer to be the adjusted estimated host timeout value.

In some implementations, the adaptive watchdog module may continuously monitor and determine the host timeout reset intervals and the memory operation latencies in the manner discussed above and below. The adaptive watchdog module may adapt the adaptive watchdog module timer value each time the host timeout reset signal is received or after a threshold number of host timeout reset signals. The adaptive watchdog module may adapt the timer value each time a threshold number of commands are performed. In some implementations, the adaptive watchdog module may adapt the timer value after a threshold period of time since the last time the adaptive watchdog module timer value was updated. In some implementations, after a threshold period of time (e.g., one week or one full battery cycle or after an application is closed), the adaptive watchdog module may reset the adaptive watchdog module timer value to a default value. The default value may correspond to the value set for the adaptive watchdog module at the time the adaptive watchdog module was manufactured. In some implementations, the adaptive watchdog module may determine that a new software update was received for the host or new firmware was installed on the host and, in response, the adaptive watchdog module may reset the adaptive watchdog module timer value to a default value.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, and the like. These electronic devices may run various applications that each have different storage device needs and behaviors. Some applications may need frequent access to the storage devices (e.g., memory devices). Latencies seen by such applications in performing storage operations may surpass those seen by other applications. Because of the difference in latencies, having a fixed timeout value for the memory device watchdog may result in inefficient and unstable behavior. In particular, for an application that has many memory operations resulting in greater latencies, having a watchdog timer value that is too short may result in the memory device performing self-reset when there are no error conditions. On the other hand, for an application that has few memory operations resulting in small latencies, having a watchdog timer value that is too long may result in the host having to reset the memory device before the memory device can detect a fault or crash condition. Waiting for the host to reset the memory device is inefficient and burdens the host. The adaptive watchdog module, according to some embodiments, can adapt the timeout value of the watchdog module depending on the particular host coupled to the memory device and the particular memory needs of one or more applications running on the host. This results in a technological solution that provides a technological improvement over typical fixed watchdog timer values by reducing inefficiencies resulting from such fixed watchdog timer values. Particularly, the adaptive watchdog module, according to some embodiments, self-resets or resets the memory device before and independent of the host timing out and resetting the device. Namely, the host does not need to be involved in resetting the memory device because the adaptive watchdog module is adaptive to the particular host and memory device operation latencies and can reset the memory device before the host is involved.

This technological improvement results in minimizing erroneous watchdog fire events (self-reset triggers) in which the watchdog performs a self-reset when the device is in a safe operating state, and minimizes host-detected watchdog events in which the host detects an error before the watchdog and issues the reset signal before the watchdog. This technological improvement also avoids having to set a fixed watchdog timer value during manufacture depending on the host to which the memory device is going to be coupled or the platform of the target embedded device.

Figure 1:
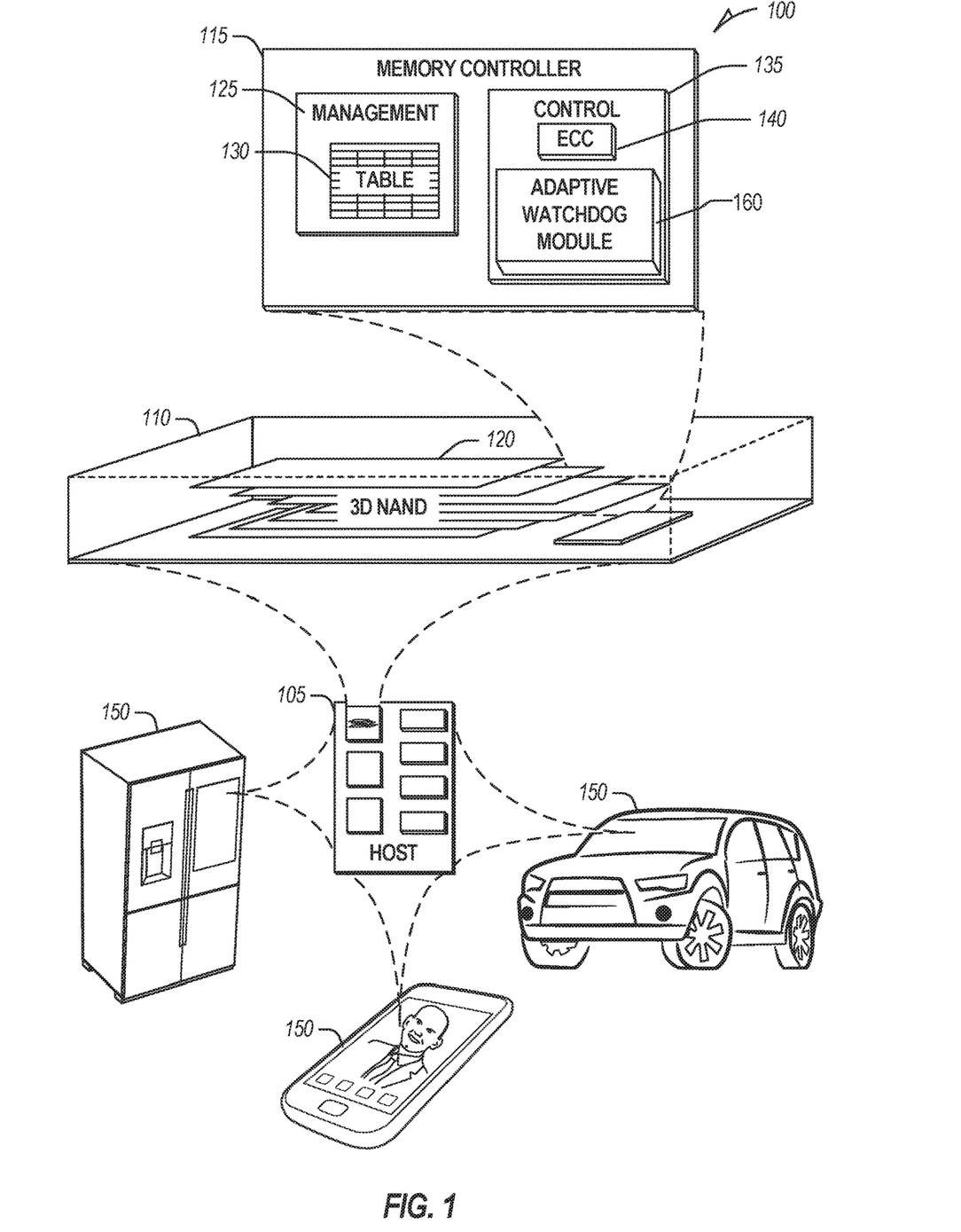
FIG. 1 illustrates an example of an environment including a memory device upon which one or more embodiments may be implemented.

FIG. 1 illustrates an example of an environment 100 including a host 105 and a memory device 110 configured to communicate over a communication interface. The host 105 or the memory device 110 may be included in a variety of products 150, such as IoT devices (e.g., a refrigerator or other appliance, sensor, motor or actuator, mobile communication device, automobile, mobile phone, drone, etc.) to support processing, communications, or control of the product 150.

The memory device 110 includes a memory controller 115 and a memory array 120 including, for example, one or more individual memory die (e.g., a stack of three-dimensional (3D) NAND die). In 3D architecture semiconductor memory technology, vertical structures are stacked in multiple tiers, and coupled to form physical pages, to increase the storage density of a memory device (e.g., a storage device) in a given footprint (i.e. form factor). In an example, the memory device 110 can be a discrete memory or storage device component of the host 105. In other examples, the memory device 110 can be a portion of an integrated circuit (e.g., system on a chip (SOC), die, etc.), stacked or otherwise included with one or more other components of the host 105.

One or more communication interfaces can be used to transfer data between the memory device 110 and one or more other components of the host 105, such as a Serial Advanced Technology Attachment (SATA) interface, a Peripheral Component Interconnect Express (PCIe) interface, a Universal Serial Bus (USB) interface, a UFS interface, an eMMC™ interface, or one or more other connectors or interfaces. The host 105 can include a host system, an electronic device, a processor, a memory card reader, or one or more other electronic devices external to the memory device 110. In some examples, the host 105 may be a machine having some portion, or all, of the components discussed in reference to the machine 600 of FIG. 6. Data may be transferred between the memory device 110 and other components over an input/output (I/O) bus that may include one or more latches for temporarily storing the data as it is being transferred (e.g., before being read or written from/to a memory array).

The memory controller 115 can receive instructions from the host 105, and can communicate with the memory array, such as to transfer data to (e.g., write or erase) or from (e.g., read) one or more of the memory cells, planes, sub-blocks, blocks, or pages of the memory array. The memory controller 115 can include, among other things, circuitry or firmware, including one or more components or integrated circuits. For example, the memory controller 115 can include one or more memory control units, circuits, control circuitries, or components configured to control access across the memory array 120 and to provide a translation layer between the host 105 and the memory device 110. The memory controller 115 can include one or more I/O circuits (and corresponding latches), lines, or interfaces to transfer data to or from the memory array 120. The memory controller 115 can include a memory manager 125 and an array controller 135.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. ECC component 140, for example, may detect or compute a bit-error-rate (BER) associated with performing a number of memory operations. The BER may correspond to bit errors occurring in latches of an I/O bus, internal errors of controller 115, errors occurring in one or more of the NAND arrays, or any one or more of the multi-level cell(s) (MLC) of the memory device 110. The memory controller 115 can be configured to actively detect and recover from error occurrences (e.g., bit errors, operation errors, crash conditions, stalls, hang ups, etc.) associated with various operations or storage of data, while maintaining integrity of the data transferred between the host 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors. Array controller 135 may transmit detected BER information to memory manager 125 for storage and tracking. The memory controller 115 may include a command queue (not shown) that tracks memory commands received from a host. Commands in the queue may be executed by controller 115 in a first-in first-out (FIFO) manner, stack manner, out of sequence, according to priority, or in any other suitable order.

The described memory device 110 includes an adaptive watchdog module 160 in association with the memory array 120. As discussed in more detail in reference to FIG. 2, the adaptive watchdog module includes a watchdog timer (210 in FIG. 2). In some implementations, controller 115 of memory device 110 may include control circuitry configured to implement the functions of adaptive watchdog module 160. In other implementations, adaptive watchdog module 160 may include an independent control circuitry for implementing the described functionality. In yet other implementations, control circuitry may be divided between adaptive watchdog module 160 and controller 115 to implement the described functions of adaptive watchdog module 160. In the depicted example, the array controller 135 forms a portion of the memory controller 115, and the adaptive watchdog module 160 forms a portion of the array controller. In other implementations, adaptive watchdog module 160 may be external, and/or outside of array controller 135. For example, adaptive watchdog module 160 (or any individual components thereof), may be an independent component coupled to one or more components in environment 100. For example, adaptive watchdog module 160 may be a separate device on a separate die from that on which memory device 110 is implemented. In cases where adaptive watchdog module 160 is implemented outside of array controller 135, adaptive watchdog module 160 may communicate with components (e.g., a command queue) on the memory device to obtain memory operation commands status information from memory device 110. However physically located, the watchdog timer 210, and when present, the structures providing the additional functionality of adaptive watchdog module 160, function to control the memory array and to provide a separate watchdog timer structure and functionality than are implemented independently by a host, as in some conventional memory devices.

An exemplary implementation of adaptive watchdog module 160 is described below in connection with FIG. 2.

In some implementations, the adaptive watchdog module 160 may monitor host interactions with memory device 110 and memory command latencies in memory device 110. The adaptive watchdog module 160 may reset controller 135 or any other component of memory device 110 when a timer of adaptive watchdog module 160 reaches a timer value of adaptive watchdog module 160. In some implementations, adaptive watchdog module 160 may detect a host reset signal being received by controller 135 and, in response, adaptive watchdog module 160 may retrieve a timestamp of the earliest or latest command stored in the command queue of controller 135. The adaptive watchdog module 160 may compute a difference between a timestamp of the host reset signal and the retrieved timestamp to estimate the host timeout period. The adaptive watchdog module 160 may adjust the estimated host timeout period by reducing the estimated host timeout period by a threshold amount and set the timer value of adaptive watchdog module 160 to the adjusted estimated host timeout period. In some implementations, adaptive watchdog module 160 may perform such adjustments after a threshold number of host reset signals are detected.

In some implementations, adaptive watchdog module 160 may detect that a given command has completed (exited the command queue of controller 135). In response, adaptive watchdog module 160 may obtain a timestamp representing when that command entered the queue (was received from the host) and compare that timestamp with a current time at which the given command completed to determine a latency of the command. The adaptive watchdog module 160 may continue computing latencies of many other commands or a threshold number of commands in a similar manner. The adaptive watchdog module 160 may identify the average or maximum among the computed latencies to determine a latency of memory device 110 (e.g., the latencies for a given application(s) operating on the memory device). The adaptive watchdog module 160 may adjust the determined latency by increasing the determined latency by a threshold amount and set the timer value of adaptive watchdog module 160 to the adjusted latency. In some implementations, adaptive watchdog module 160 may determine the memory latency based on classes of commands or based on priorities associated with different classes of commands.

In some implementations, adaptive watchdog module 160 may perform such adjustments after a threshold time has elapsed, after new firmware is installed, after a new application is launched, or at any other suitable period of time. In some implementations, the adaptive watchdog module 160 may compare the adjusted latency to the adjusted estimated host timeout period and set the timer value of adaptive watchdog module 160 to the minimum of the two periods (e.g., whichever one of the adjusted latency and the adjusted estimated host timeout period is a lower value).

The memory manager 125 can include, among other things, circuitry or firmware, such as a number of components or integrated circuits associated with various memory management functions. For purposes of the present description, example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection (e.g., BER monitoring) or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more components of the memory device 110 (e.g., various information associated with a memory array or one or more memory cells coupled to the memory controller 115). For example, the management tables 130 can include information regarding block age, block erase count, error history, error parameter information, host reset timeout value, memory operation command latencies, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts (e.g., an error parameter) is above a threshold (e.g., an allowable error threshold), the bit error can be referred to as an uncorrectable bit error. The management tables 130 can maintain a count of correctable or uncorrectable bit errors, among other things. The management table 130 may also keep track of, store, and monitor a number of times the value of the timer of adaptive watchdog module 160 changed, the last time the value was changed, and the timestamp of one or more commands or reset signals.

The memory array 120 can include multiple memory cells arranged in, for example, a number of devices, planes, sub-blocks, blocks, or pages. As one example, a 48 GB TLC NAND memory device can include 18,592 bytes of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, may be selectively operated in SLC mode, or in a desired MLC mode (such as TLC, QLC, etc.).

In operation, data is typically written to or read from the memory device 110 in pages and erased in blocks. However, one or more memory operations (e.g., read, write, erase, etc.) can be performed on larger or smaller groups of memory cells, as desired. The data transfer size of a memory device 110 is typically referred to as a page, whereas the data transfer size of a host is typically referred to as a sector.

Different types of memory cells or memory arrays 120 can provide for different page sizes or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a MLC NAND flash device may have a higher bit error rate than a corresponding single-level cell (SLC) NAND flash device. As such, the MLC device may require more metadata bytes for error data than the corresponding SLC device.

Blocks of memory cells in NAND devices may be reconfigured during operation to work in SLC mode (for example, though not necessarily as cache) or any of multiple MLC modes. As a result, the latencies associated with different memory operations may change during operation of the device. Particularly, different operating modes of the given memory device may have different latencies that influence the watchdog timer value because the memory device in a given mode should be able to tolerate larger or smaller command latencies than in another mode. Particularly, in one mode, the memory operation command latency may be higher than the memory operation command latency in another mode. As such, the watchdog timer value of adaptive watchdog module 160 for a first mode may be greater than the watchdog timer value of adaptive watchdog module 160 of a second mode. The adaptive watchdog module 160 may receive an indication from the memory device as to the current mode of operation and may configure the timeout value based on the established timeout value associated with the given mode. During operation, the timeout value of adaptive watchdog module 160 may change based on an analysis of the memory operation command latencies of one or more applications when the memory device operates in the given mode.

Figure 2:
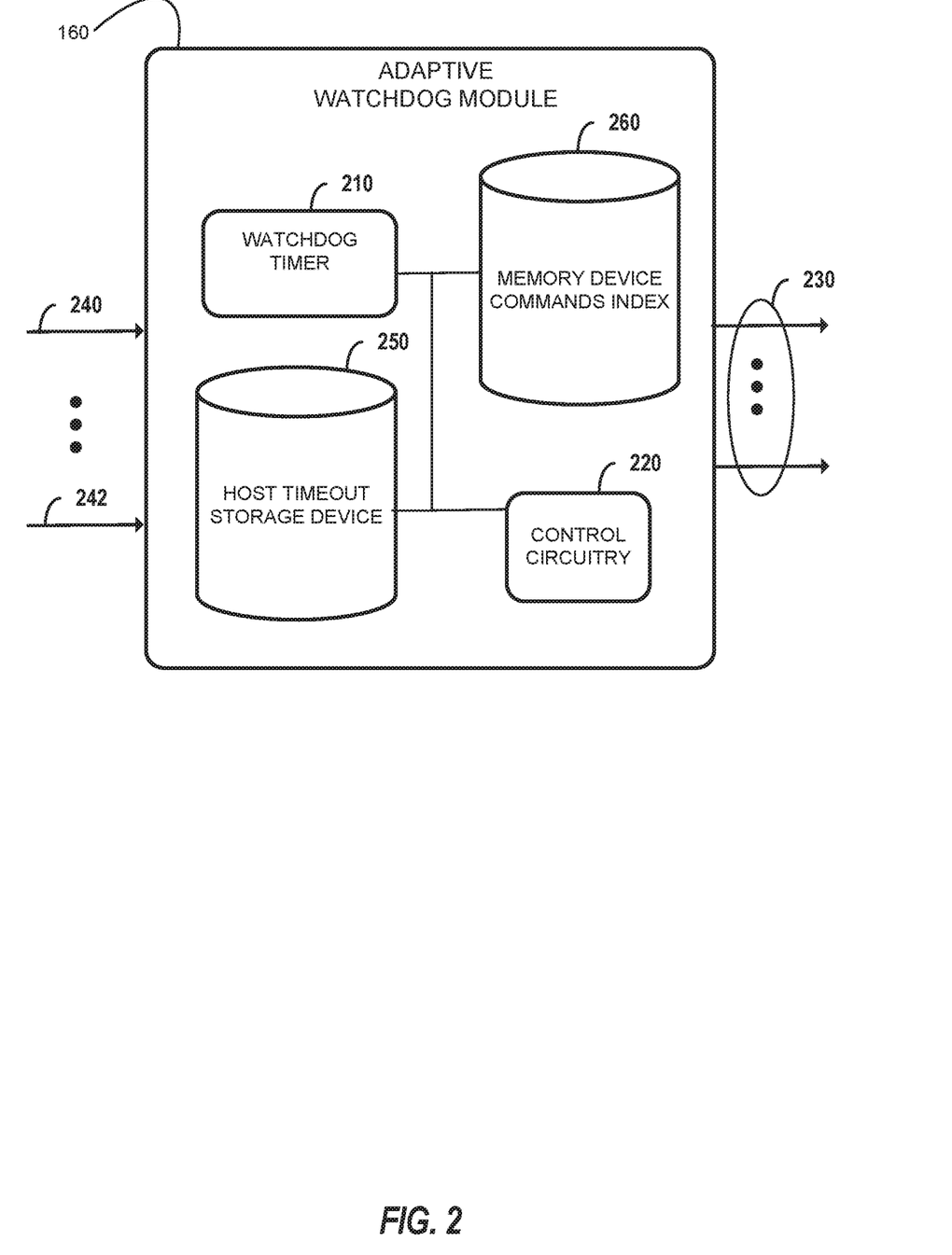
FIG. 2 is a block diagram illustrating an example of an adaptive watchdog module upon which one or more embodiments may be implemented.

FIG. 2 is a block diagram illustrating an example of adaptive watchdog module 160, upon which one or more embodiments may be implemented. Adaptive watchdog module 160 may include a watchdog timer 210, a memory device commands index 260, a host timeout storage device 250, and control circuitry 220. Watchdog timer 210 may include a free running timer circuit or may implement functionality of a free running timer that start counting from 0 or some other preset value to another target value each time the timer is reset or reaches the target value. Setting the timer of watchdog timer 210 includes setting the value of the target value. Index 260 and device 250 may be implemented by any suitable memory or storage circuitry and may optionally be combined into the same physical storage device. Control circuitry 220 may be implemented by any suitable dedicated circuitry, programmable device, or processor, such as a general purpose processor, configured to perform the functions of adaptive watchdog module 160 in accordance with the processes discussed in FIGS. 4 and 5.

Adaptive watchdog module 160 may receive host reset signal 240 and memory device operation commands 242. Host reset signal 240 may be received directly from the host device or may be provided by a memory controller indicating the host reset signal was received from the host or the timestamp associated with such a host reset signal. Memory device operation commands 242 may be provided directly to adaptive watchdog module 160 or may be provided by a controller or command queue of the memory device. Commands 242 may include only the timestamp and class of a given command (rather than the data or command itself) and an indication of whether the command is newly received from the host or has been completed by the memory device. Commands 242 may include all of the contents of a command received from the host and in such circumstances adaptive watchdog module 160 may process the commands to extract the class of the command and generate a timestamp for the command.

Watchdog timer 210 may include a free running timer circuit and a timer value. Watchdog timer 210 may start counting time from zero each time a reset signal is received from control circuitry 220, each time a new command is received, or each time a command completes being executed by the memory device. Upon reaching the timer value, watchdog timer 210 may generate a signal or interrupt to control circuitry 220. In response, control circuitry 220 may transmit, to one or more devices, a watchdog self-reset signal 230 to reset the memory controller and/or an associated memory device 110. In some implementations, multiple watchdog timers 210 may be included in adaptive watchdog module 160. In such circumstances, each watchdog timer 210 may generate a self-reset signal for the memory device associated with the watchdog timer 210. Each of the multiple watchdog timers 210 may operate using the same or different watchdog timer value that is adjustable in the manner disclosed.

In some implementations, in response to receiving a command 242, control circuitry 220 may obtain a timestamp for the command and store the command along with the timestamp in memory device commands index 260. In some implementations, control circuitry 220 may generate a unique identifier for the received command and associate that identifier with the generated timestamp for storage in index 260. Control circuitry 220 may continue processing commands 242 in a similar manner until a threshold number of commands are stored in index 260. As control circuitry 220 receives or detects, via commands 242, that a given command (or command associated with a particular identifier) has completed being processed by the memory device, control circuitry 220 may generate a new timestamp for the completed command, search index 260 for the matching command, and compare the timestamp stored in index 260 (when the command was initially received from the host) to the new timestamp to compute a command latency for the command. Control circuitry 220 may adjust the computed latency by increasing the value by a threshold amount and storing the determined latency in index 260. In some implementations, control circuitry 220 may determine a class of command associated with the determined latency and update a latency stored in index 260 for that class of command. For example, control circuitry 220 may compute an average or maximum between the stored latency in index 260 and the determined latency of the last command that completed.

In some implementations, control circuitry 220 may classify commands 242 and update or change the latency associated with that class of commands stored in index 260. In some implementations, each class of commands may be associated with a different priority stored in index 260. In some implementations, control circuitry 220 may change the priorities associated with the different classes in response to different applications being executed by the host.

In some implementations, control circuitry 220 may detect a reset signal 240 being received. In response to detecting the reset signal, control circuitry 220 may determine whether a threshold number of previous reset signals was received to begin the process for adjusting the adaptive watchdog module 160. In some implementations, adaptive watchdog module 160 may adjust the adaptive watchdog module 160 timer each time a reset signal 240 is received. In any case, control circuitry 220 may search index 260 to identify the oldest or newest command stored in index 260 (e.g., the command with the oldest or newest timestamp). Control circuitry 220 may compute a new timestamp of reset signal 240 and compare the computed new timestamp to the identified oldest or newest command stored in index 260. Based on this comparison, control circuitry 220 may determine an estimated host timeout period of the host. Control circuitry 220 may adjust the estimated host timeout period by decreasing the estimated timeout period by a threshold amount and store the adjusted estimated host timeout period in host timeout storage device 250.

In some implementations, control circuitry 220 may set the timer value of watchdog timer 210 based on the adjusted estimated host timeout value stored in device 250 or the adjusted memory device latency stored in index 260. In some implementations, control circuitry 220 may set the timer value based on the latency stored in index 260 with the highest priority. In some implementations, control circuitry 220 may set the timer value to a minimum between the adjusted estimate host timeout value stored in device 250 and the adjusted memory device latency stored in index 260 (or the adjusted memory device latency with the highest priority).

Figure 3:
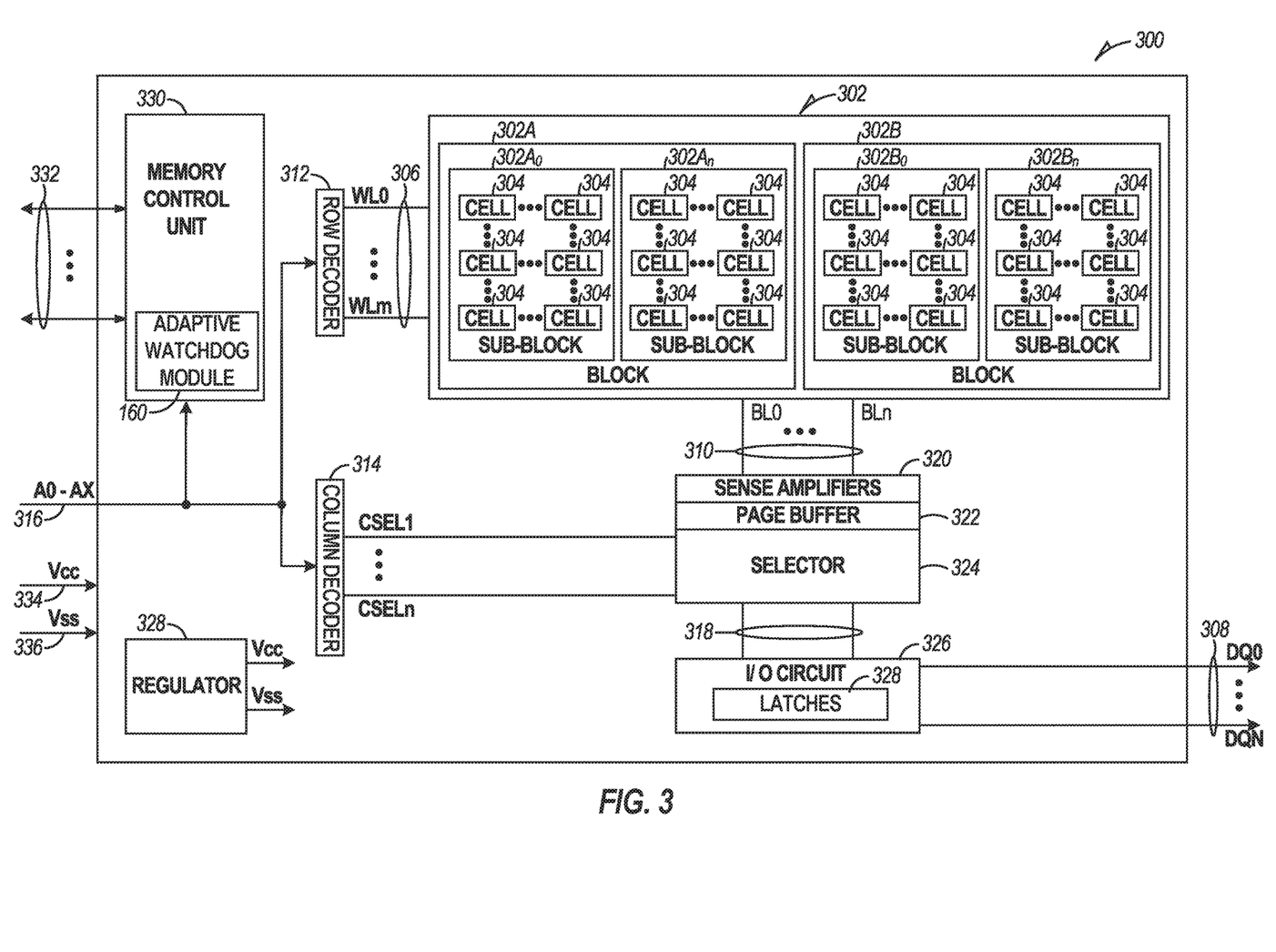
FIG. 3 illustrates an example block diagram of a memory module upon which one or more embodiments may be implemented.

FIG. 3 illustrates an example block diagram of a memory device 300 including a memory array 302 having a plurality of memory cells 304, and one or more circuits or components to provide communication with, or perform one or more memory operations on, the memory array 302. The memory device 300 can include a row decoder 312, a column decoder 314, sense amplifiers 320, a page buffer 322, a selector 324, an I/O circuit 326, and a memory control unit 330.

The memory cells 304 of the memory array 302 can be arranged in blocks, such as first and second blocks 302A, 302B. Each block can include sub-blocks. For example, the first block 302A can include first and second sub-blocks $302A_0$, $302A_n$, and the second block 302B can include first and second sub-blocks $302B_0$, $302B_n$. Each sub-block can include a number of physical pages, with each page including a number of memory cells 304. Although illustrated herein as having two blocks, with each block having two sub-blocks, and each sub-block having a number of memory cells 304, in other examples, the memory array 302 can include more or fewer blocks, sub-blocks, memory cells, and so forth. In other examples, the memory cells 304 can be arranged in a number of rows, columns, pages, sub-blocks, blocks, and the like, and accessed using, for example, access lines 306, first data lines 310, or one or more select gates, source lines, and so forth.

The memory control unit 330 can control memory operations of the memory device 300 according to one or more signals or instructions received on control lines 332, including, for example, one or more clock signals or control signals that indicate a desired operation (e.g., write, read, erase, etc.), or address signals (A0-AX) received on one or more address lines 316. One or more devices external to the memory device 300 (e.g., a host, as discussed relative to FIG. 1) can control the values of the control signals on the control lines 332, or the address signals on the address line 316. Examples of devices external to the memory device 300 can include, but are not limited to, a host, a memory controller, a processor, or one or more circuits or components not illustrated in FIG. 3.

In some implementations, memory control unit 330 may include adaptive watchdog module 160. Memory control unit 330 may implement some or all of the functionality of memory controller 115 (FIG. 1). Adaptive watchdog module 160 may be configured to trigger a self-reset in memory control unit 330 and any other suitable component of memory device 300 when a watchdog timer value is reached.

The memory device 300 can use access lines 306 and first data lines 310 to transfer data to (e.g., write or erase) or from (e.g., read) one or more of the memory cells 304. The row decoder 312 and the column decoder 314 can receive and decode the address signals (A0-AX) from the address line 316, determine which of the memory cells 304 are to be accessed, and provide signals to one or more of the access lines 306 (e.g., one or more of a plurality of word lines (WL0-WLm)) or the first data lines 310 (e.g., one or more of a plurality of bit lines (BL0-BLn)), such as described above.

The memory device 300 can include sense circuitry, such as the sense amplifiers 320, configured to determine the values of data on (e.g., read), or to determine the values of data to be written to, the memory cells 304 using the first data lines 310. For example, in a selected string of memory cells 304, one or more of the sense amplifiers 320 can read a logic level in the selected memory cell 304 in response to a read current flowing in the memory array 302 through the selected string to the data lines 310.

One or more devices external to the memory device 300 can communicate with the memory device 300 using the I/O lines (DQ0-DQN) 308, address lines 316 (A0-AX), or control lines 332. The input/output (I/O) circuit 326 can transfer values of data in or out of the memory device 300, such as in or out of the page buffer 322 or the memory array 302, using the I/O lines 308, according to, for example, the control lines 332 and address lines 316. For example, I/O circuit 326 may include one or more latches 328 for temporarily storing data to be written to memory array 302 and data to be read by the one or more external devices from memory array 302. The page buffer 322 can store data received from the one or more devices external to the memory device 300 before the data is programmed into relevant portions of the memory array 302, or can store data read from the memory array 302 before the data is transmitted to the one or more devices external to the memory device 300.

The column decoder 314 can receive and decode address signals (A0-AX) into one or more column select signals (CSEL1-CSELn). The selector 324 (e.g., a select circuit) can receive the column select signals (CSEL1-CSELn) and select data in the page buffer 322 representing values of data to be read from or to be programmed into memory cells 304. Selected data can be transferred between the page buffer 322 and the I/O circuit 326 using second data lines 318.

The memory control unit 330 can receive positive and negative supply signals, such as a supply voltage (Vcc) 334 and a negative supply (Vss) 336 (e.g., a ground potential), from an external source or supply (e.g., an internal or external battery, an AC-to-DC converter, etc.). In certain examples, the memory control unit 330 can include a regulator 328 to internally provide positive or negative supply signals.

Figure 4:
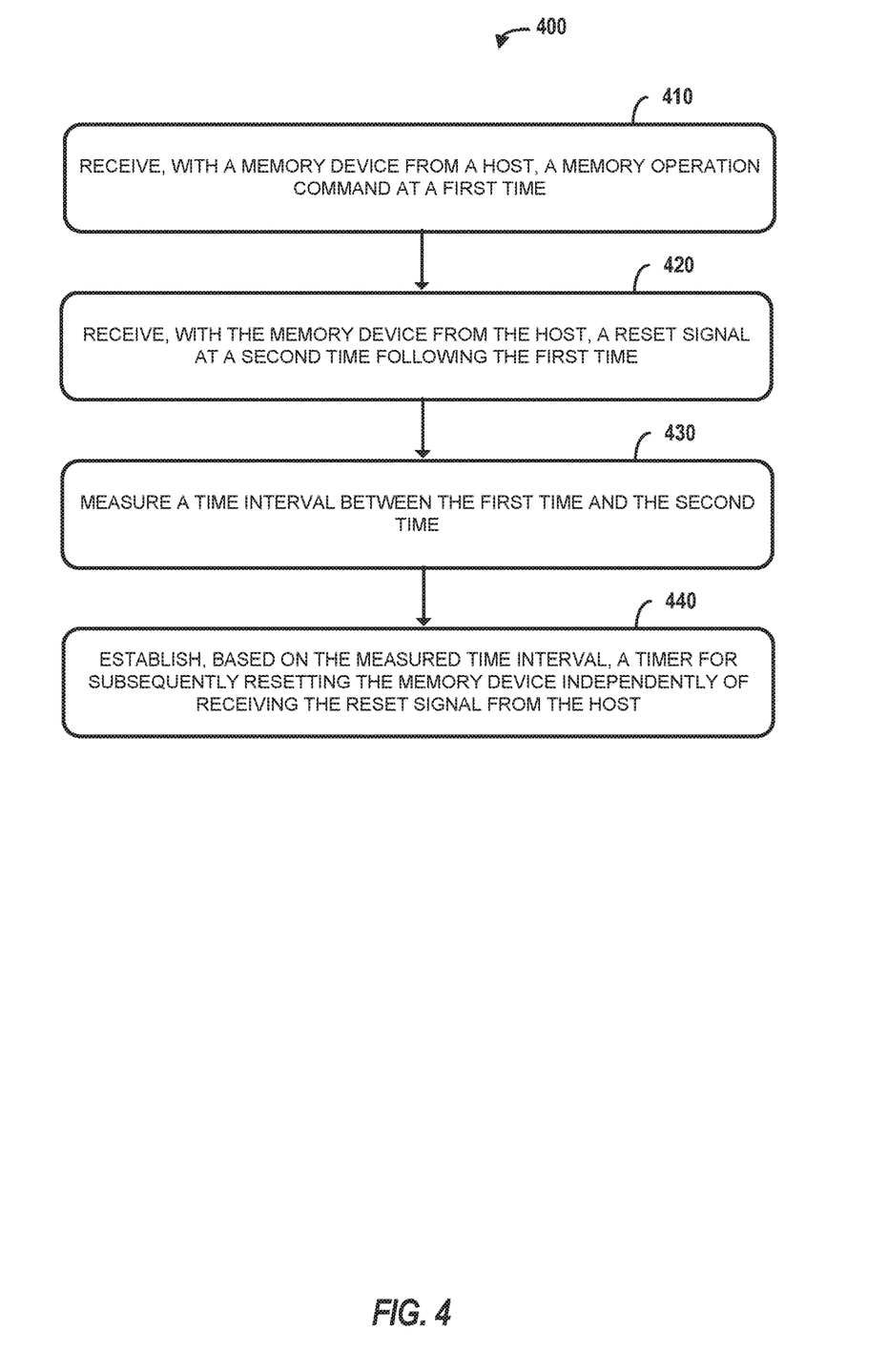
FIG. 4 is a flow chart of a process for establishing parameters of an adaptive watchdog module upon which one or more embodiments may be implemented.

FIG. 4 is a flow chart of a process 400 for establishing parameters of an adaptive watchdog module upon which one or more embodiments may be implemented. At 410, a memory operation command is received with a memory device from a host at a first time. For example, adaptive watchdog module 160 may receive a memory device command 242. Adaptive watchdog module 160 may generate a timestamp for the received command and store the generated timestamp in association with the command in index 260 (FIG. 2).

At 420, a reset signal is received at a second time following the first time with the memory device from the host. For example, adaptive watchdog module 160 may receive a reset signal 240 from the host (directly or indirectly). The adaptive watchdog module 160 may generate a timestamp for the reset signal indicating when the reset signal was received.

At 430, a time interval is measured between the first time and the second time. For example, adaptive watchdog module 160 may identify a corresponding command associated with the reset signal (e.g., the oldest or newest command stored in the command queue or index 260). The adaptive watchdog module 160 may compute a difference between the timestamp of the identified command and the timestamp of the reset signal to estimate the host timeout interval.

At 440, a timer for subsequently resetting the memory device independently of receiving the reset signal from the host is established based on the measured time interval. For example, adaptive watchdog module 160 may establish the value for watchdog timer 210 (e.g., the value reached by the free running counter of timer 210 at which the timer 210 triggers a self-reset signal) to be the measured time interval minus a threshold amount.

Figure 5:
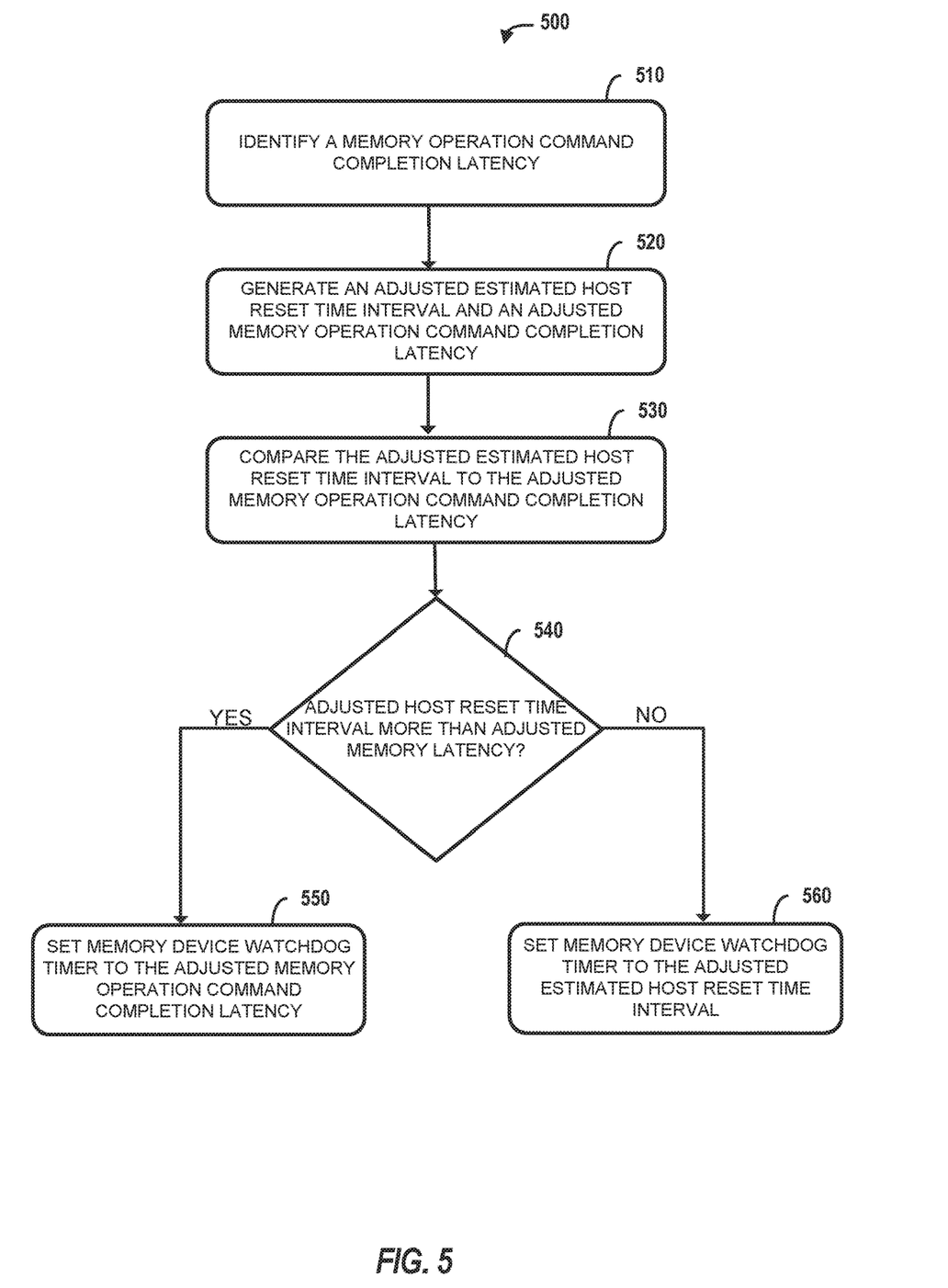
FIG. 5 is a flow chart of a process for establishing parameters of an adaptive watchdog module based on a host timeout event and memory latency upon which one or more embodiments may be implemented.

FIG. 5 is a flow chart of a process 500 for establishing parameters of an adaptive watchdog module based on a host timeout event and memory latency upon which one or more embodiments may be implemented. At 510, a memory operation command completion latency is identified. For example, adaptive watchdog module 160 may associate a timestamp with a memory device command or class of commands when the command is received. After determining that the command or class of commands completed, adaptive watchdog module 160 may generate another timestamp and compare the new timestamp with the old timestamp to determine a memory latency for the command or class of commands. The adaptive watchdog module 160 may adjust the determined memory latency by increasing the determined memory latency by a threshold amount to identify the adjusted memory operation command completion latency.

At 520, an adjusted estimated host reset time interval and an adjusted memory operation command completion latency are generated. For example, adaptive watchdog module 160 may retrieve an estimated host timeout from device 250 (previously generated based on a difference between when a command was received and when a host timeout reset signal was detected) and may reduce the estimated host timeout value by a threshold amount to generate the adjusted estimated host reset time interval. Adaptive watchdog module 160 may increase the determined memory operation command completion latency by a threshold amount to generate an adjusted memory operation command completion latency.

At 530, the adjusted estimated host reset time interval is compared to the adjusted memory operation command completion latency.

At 540, a determination is made as to whether the adjusted estimated host reset time interval is more than the adjusted memory operation command completion latency. In response to determining that the adjusted host reset time interval is more than the adjusted memory operation command completion latency, the process proceeds to 550; otherwise the process proceeds to 560.

At 550, the memory device watchdog timer is set to the adjusted memory operation command completion latency. For example, adaptive watchdog module 160 may update or change the timer value of watchdog timer 210 based on the adjusted memory operation command completion latency.

At 560, the memory device watchdog timer is set to the adjusted estimated host reset time interval. For example, adaptive watchdog module 160 may update or change the timer value of watchdog timer 210 based on the adjusted estimated host reset time interval.

Processes 400 and 500 may be performed by any control circuitry or may be performed by dedicated circuitry (e.g., control circuitry 220 (FIG. 2)). Any step in process 400 and 500 may be performed out of the sequence represented in FIGS. 4 and 5 or may be entirely omitted.

Figure 6:
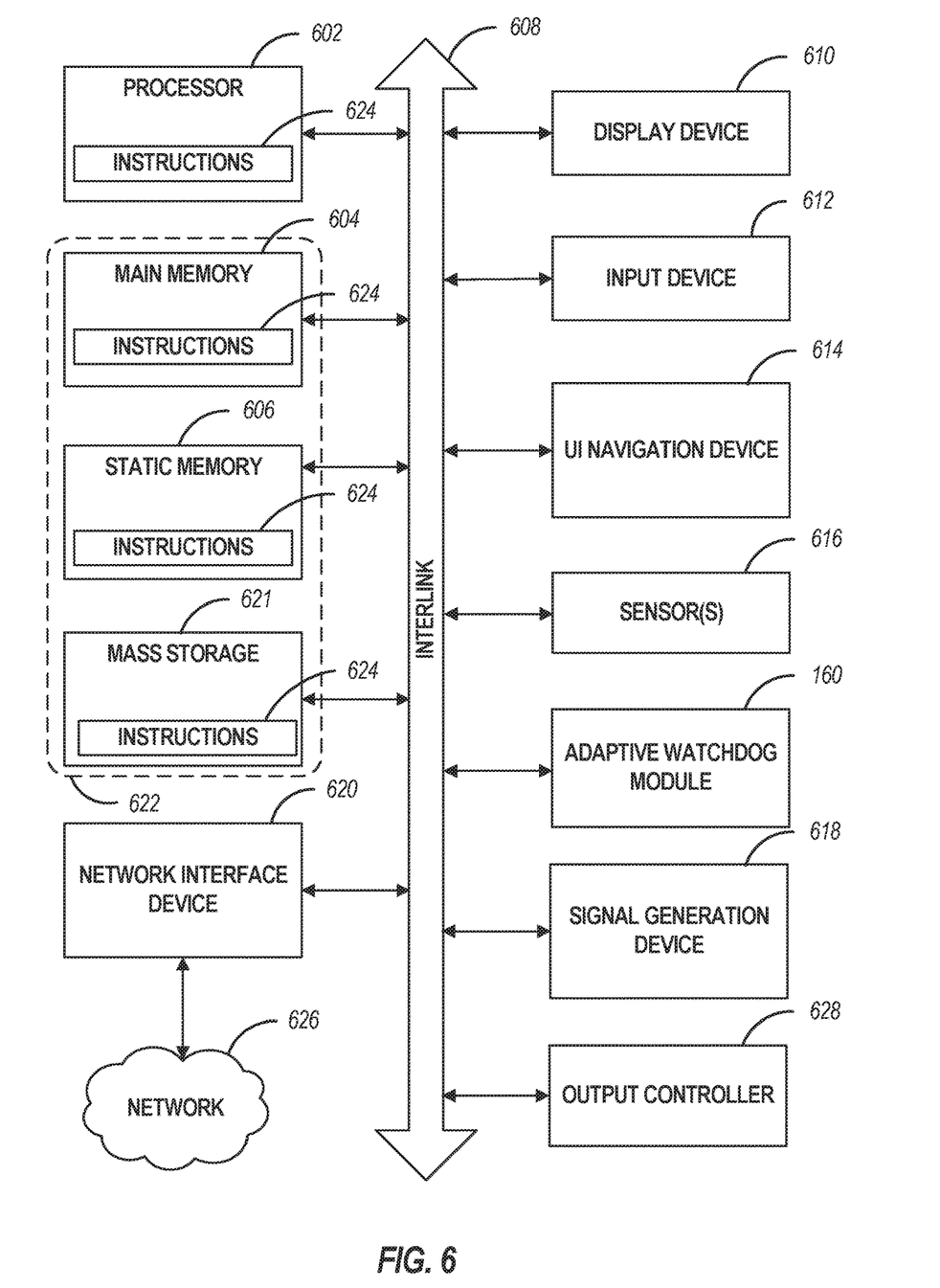
FIG. 6 is a block diagram illustrating an example of a machine upon which one or more embodiments may be implemented.

FIG. 6 illustrates a block diagram of an example machine 600 upon which any one or more of the techniques (e.g., methodologies) discussed herein may perform. In alternative embodiments, the machine 600 may operate as a standalone device or may be connected (e.g., networked) to other machines. In a networked deployment, the machine 600 may operate in the capacity of a server machine, a client machine, or both in server-client network environments. In an example, the machine 600 may act as a peer machine in peer-to-peer (P2P) (or other distributed) network environment. The machine 600 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 600 (e.g., the host 105, the memory device 110, etc.) may include a hardware processor 602 (e.g., a central processing unit (CPU), a graphics processing unit (GPU), a hardware processor core, or any combination thereof, such as the memory controller 115, etc.), a main memory 604 and a static memory 606, some or all of which may communicate with each other via an interlink (e.g., bus) 608. The machine 600 may further include a display unit 610, an alphanumeric input device 612 (e.g., a keyboard), and a user interface (UI) navigation device 614 (e.g., a mouse). In an example, the display unit 610, input device 612, and UI navigation device 614 may be a touch screen display. The machine 600 may additionally include a storage device (e.g., drive unit) 621, a signal generation device 618 (e.g., a speaker), a network interface device 620, one or more sensors 616, such as a global positioning system (GPS) sensor, compass, accelerometer, or other sensor, and one or more adaptive watchdog module (s) 160. The machine 600 may include an output controller 628, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 621 may include a machine readable medium 622 on which is stored one or more sets of data structures or instructions 624 (e.g., software) embodying or utilized by any one or more of the techniques or functions described herein. The instructions 624 may also reside, completely or at least partially, within the main memory 604, within static memory 606, or within the hardware processor 602 during execution thereof by the machine 600. In an example, one or any combination of the hardware processor 602, the main memory 604, the static memory 606, or the storage device may constitute the machine readable medium 622.

While the machine readable medium 622 is illustrated as a single medium, the term "machine readable medium" may include a single medium or multiple media (e.g., a centralized or distributed database, or associated caches and servers) configured to store the one or more instructions 624.

The term "machine readable medium" may include any transitory or non-transitory medium that is capable of storing, encoding, or carrying transitory or non-transitory instructions for execution by the machine 600 and that cause the machine 600 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 624 (e.g., software, programs, an operating system (OS), etc.) or other data stored on the storage device 621 can be accessed by the memory 604 for use by the processor 602. The memory 604 (e.g., DRAM) is typically fast, but volatile, and thus a different type of storage than the storage device 621 (e.g., an SSD), which is suitable for long-term storage, including while in an "off" condition. The instructions 624 or data in use by a user or the machine 600 are typically loaded in the memory 604 for use by the processor 602. When the memory 604 is full, virtual space from the storage device 621 can be allocated to supplement the memory 604; however, because the storage 621 device is typically slower than the memory 604, and write speeds are typically at least twice as slow as read speeds, use of virtual memory can greatly reduce user experience due to storage device latency (in contrast to the memory 604, e.g., DRAM). Further, use of the storage device 621 for virtual memory can greatly reduce the usable lifespan of the storage device 621.

In contrast to virtual memory, virtual memory compression (e.g., the Linux® kernel feature "ZRAM") uses part of the memory as compressed block storage to avoid paging to the storage device 621. Paging takes place in the compressed block until it is necessary to write such data to the storage device 621. Virtual memory compression increases the usable size of memory 604, while reducing wear on the storage device 621.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, and so forth. In response to this demand, storage devices have shifted from parallel to serial communication interfaces. UFS devices, including controllers and firmware, communicate with a host device using a low-voltage differential signaling (LVDS) serial interface with dedicated read/write paths, further advancing greater read/write speeds.

The instructions 624 may further be transmitted or received over a communications network 626 using a transmission medium via the network interface device 620 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 620 may include one or more physical jacks (e.g., Ethernet, coaxial, or phone jacks) or one or more antennas to connect to the communications network 626. In an example, the network interface device 620 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 600, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, control circuitry, a digital signal processor (DSP), or any other type of processor or processing circuit, including a group of processors or multi-core devices.

In some embodiments described herein, different doping configurations may be applied to a source-side select gate (SGS), a control gate (CG), and a drain-side select gate (SGD), each of which, in this example, may be formed of or at least include polysilicon, with the result such that these tiers (e.g., polysilicon, etc.) may have different etch rates when exposed to an etching solution. For example, in a process of forming a monolithic pillar in a 3D semiconductor device, the SGS and the CG may form recesses, while the SGD may remain less recessed or even not recessed. These doping configurations may thus enable selective etching into the distinct tiers (e.g., SGS, CG, and SGD) in the 3D semiconductor device by using an etching solution (e.g., tetramethylammonium hydroxide (TMCH)).

Operating a memory cell or performing a memory (or memory device) operation, as used herein, includes reading from, writing to, or erasing the memory cell or memory (or memory device). The operation of placing a memory cell in an intended state is referred to herein as "programming," and can include both writing to or erasing from the memory cell (e.g., the memory cell may be programmed to an erased state).

It will be understood that when an element is referred to as being "on," "connected to," or "coupled with" another element, it can be directly on, connected, or coupled with the other element or intervening elements may be present. In contrast, when an element is referred to as being "directly on," "directly connected to," or "directly coupled with" another element, there are no intervening elements or layers present. If two elements are shown in the drawings with a line connecting them, the two elements can be either be coupled, or directly coupled, unless otherwise indicated.

It will be understood that the term module (e.g., adaptive watchdog module) can refer to any combination of software and circuitry to perform or configured to perform the described function. Module may refer to a programmable device, non-programmable device, ASIC, PLD, FGPA, or other dedicated or specific circuitry or hardware element configured to perform the described function. Module may refer to software (e.g., computer readable instruction(s), code, or a program running on a computer or processor or control circuitry) configured to perform the described function.

Method examples described herein can be machine or computer-implemented at least in part. Some examples can include a transitory or non-transitory computer-readable medium or machine-readable medium encoded with transitory or non-transitory instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), SSDs, UFS devices, eMMC devices, and the like.

Examples

An example (e.g., "Example 1") of subject matter (e.g., a method or system) can include a method for receiving, with a memory device at a first time, a memory operation command from a host; receiving, with the memory device at a second time following the first time, a reset signal from the host; measuring a time interval between the first time and the second time; and establishing, based on the measured time interval, a delay interval for the timer in the memory device to reset the memory device independently of receiving a further reset signal from the host.

In Example 2, the subject matter of Example 1 can optionally be configured to establish the timer by setting the timer to a value that is less than the time interval.

In Example 3, the subject matter of Example 1 can optionally be configured such that the time interval is a first time interval and, for measuring multiple time intervals, each of the multiple time intervals represents an amount of time between the memory device receiving a given memory operation command and the memory device completing the given memory operation command; identifying the longest of the multiple time intervals as a second time interval; and establishing the timer based on the first and the second time intervals.

In Example 4, the subject matter of Example 3 can optionally be configured such that the timer is established based on the first and second time intervals and, for adjusting the first and second time intervals, determining a lowest time interval of the adjusted first and second time intervals; and establishing the timer based on the lowest time interval.

In Example 5, the subject matter of Example 4 can optionally be configured such that the first and second time intervals are adjusted by reducing the first time interval by a first threshold amount and increasing the second time interval by a second threshold amount. The first and second threshold amounts can be the same or different.

In Example 6, the subject matter of Example 5 can optionally be configured such that at least one of the first and second threshold amounts is determined based on a characteristic of the host.

In Example 7, the subject matter of Example 3 can optionally be configured for maintaining an index representing latencies associated with different classes of memory operation commands; setting priorities for each of the different classes of memory operation commands; and identifying as the second time interval a time interval of the multiple time intervals associated with the memory operation command having the highest priority.

In Example 8, the subject matter of Example 1 can optionally be configured such that the timer comprises a watchdog timer associated with the memory device.

In Example 9, the subject matter of Example 1 can optionally be configured for setting the timer to a default value after a threshold time period or in response to detecting changes to the host.

In Example 10, the subject matter of Example 1 can optionally be configured such that memory operation command comprises at least one of read, write, program, and erase.

An Example 11 of subject matter can include a memory device comprising a timer and control circuitry configured to receive, with a memory device at a first time, a memory operation command from a host; receive, with the memory device at a second time following the first time, a reset signal from the host; measure a time interval between the first time and the second time; and establish, based on the measured time interval, a delay interval for the timer in the memory device to reset the memory device independently of receiving a further reset signal from the host.

In Example 12, the subject matter of Example 11 can optionally be configured for the control circuitry to establish the timer by setting the timer to a value that is less than the time interval.

In Example 13, the subject matter of Example 11 can optionally be configured such that the time interval is a first time interval and, for the control circuitry to measure multiple time intervals, each of the multiple time intervals represent an amount of time between the memory device receiving a given memory operation command and the memory device completing the given memory operation command; identify the longest of the multiple time intervals as a second time interval; and establish the timer based on the first and the second time intervals.

In Example 14, the subject matter of Example 13 can optionally be configured such that the timer is established based on the first and the second time intervals and, for the control circuitry to adjust the first and second time intervals, determining a lowest or shortest time interval of the adjusted first and second time intervals; and establish the timer based on the lowest time interval.

In Example 15, the subject matter of Example 14 can optionally be configured such that the first and second time intervals are adjusted by reducing the first time interval by a first threshold amount and increasing the second time interval by a second threshold amount.

In Example 16, the subject matter of Example 15 can optionally be configured such that at least one of the first and second threshold amount is determined based on a characteristic of the host.

In Example 17, the subject matter of Example 13 can optionally be configured for the control circuitry to maintain an index representing latencies associated with different classes of memory operation commands; set priorities for each of the different classes of memory operation commands; and identify as the second time interval a time interval of the multiple time intervals associated with the memory operation command having the highest priority.

In Example 18, the subject matter of Example 11 can optionally be configured such that the timer comprises a watchdog timer associated with the memory device.

In Example 19, the subject matter of Example 11 can optionally be configured for the control circuitry to set the timer to a default value after a threshold time period or in response to detecting changes to the host.

In Example 20, the subject matter of Example 11 can optionally be configured such that memory operation command comprises at least one of read, write, program, and erase.

An example (e.g., "Example 21") of subject matter (e.g., a system or apparatus) can optionally combine any portion or combination of any portion of any one or more of Examples 1-20 to include "means for" performing any portion of any one or more of the functions or methods of Examples 1-20, or a "machine-readable medium" (e.g., non-transitory, etc.) including instructions that, when performed by a machine, cause the machine to perform any portion of any one or more of the functions or methods of Examples 1-20.

The above description is intended to be illustrative, and not restrictive. The scope of the invention should be determined with reference to the appended claims, along with the full scope of equivalents to which such claims are entitled.

The invention claimed is:

1. A method comprising:
   receiving, with a memory device at a first time, a memory operation command from a host;
   receiving, with the memory device at a second time following the first time, a reset signal from the host;
   measuring a time interval between the first time and the second time; and
   establishing, based on the measured time interval, a delay interval for a watchdog timer in the memory device to reset the memory device independently of receiving a further reset signal from the host.

2. The method of claim 1, wherein establishing the watchdog timer delay interval comprises setting the watchdog timer to a value that is less than the time interval.

3. The method of claim 1, wherein the time interval is a first time interval, further comprising:
   measuring multiple time intervals, each of the multiple time intervals representing an amount of time between the memory device receiving a given memory operation command request and the memory device completing the given memory operation command;
   identifying the longest of the multiple time intervals as a second time interval; and
   establishing the watchdog timer delay interval based on the first and the second time intervals.

4. The method of claim 3, wherein establishing the watchdog timer delay interval based on the first and the second time intervals comprises:
   adjusting the first and second time intervals;
   determining a lowest time interval of the adjusted first and second time intervals; and
   establishing the watchdog timer delay interval based on the lowest time interval.

5. The method of claim 4, wherein adjusting the first and second time intervals comprises reducing the first time interval by a first threshold amount and increasing the second time interval by a second threshold amount.

6. The method of claim 5, wherein at least one of the first and second threshold amounts is determined based on a characteristic of the host.

7. The method of claim 3, further comprising:
   maintaining an index representing latencies associated with different classes of memory operation commands;
   setting priorities for each of the different classes of memory operation commands; and
   identifying as the second time interval a time interval of the multiple time intervals associated with the memory operation command having the highest priority.

8. The method of claim 1, further comprising setting the watchdog timer to a default value after a threshold time period or in response to detecting changes to the host.

9. The method of claim 1, wherein the memory operation command comprises at least one of read, write, program, and erase.

10. A memory device comprising:
a watchdog timer; and
control circuitry configured to:
receive, with the memory device at a first time, a memory operation command from a host;
receive, with the memory device at a second time following the first time, a reset signal from the host;
measure a time interval between the first time and the second time; and
establish, based on the measured time interval, a delay interval for the watchdog timer in the memory device to reset the memory device independently of receiving a further reset signal from the host.

11. The memory device of claim 10, wherein the control circuitry configured to establish the watchdog timer delay interval is further configured to set the watchdog timer to a value that is less than the time interval.

12. The memory device of claim 10, wherein the time interval is a first time interval, and wherein the control circuitry is further configured to:
measure multiple time intervals, each of the multiple time intervals representing an amount of time between the memory device receiving a given memory operation command request and the memory device completing the given memory operation command;
identifying the longest of the multiple time intervals as a second time interval; and
establish the watchdog timer delay interval based on the first and the second time intervals.

13. The memory device of claim 12, wherein the control circuitry is configured to establish the watchdog timer delay interval based on the first and the second time intervals by:
adjusting the first and second time intervals;
determining a lowest time interval of the adjusted first and second time intervals; and
establishing the watchdog timer delay interval based on the lowest time interval.

14. The memory device of claim 13, wherein the control circuitry is configured to adjust the first and second time intervals by reducing the first time interval by a first threshold amount and increasing the second time interval by a second threshold amount.

15. The memory device of claim 14, wherein at least one of the first and second threshold amounts is determined based on a characteristic of the host.

16. The memory device of claim 12, wherein the control circuitry is further configured to:
maintain an index representing latencies associated with different classes of memory operation commands;
set priorities for each of the different classes of memory operation commands; and
identify as the second time interval a time interval of the multiple time intervals associated with the memory operation command having the highest priority.

17. The memory device of claim 10, wherein the control circuitry is further configured to set the watchdog timer delay interval to a default value after a threshold time period or in response to detecting changes to the host.

18. The memory device of claim 10, wherein the memory operation command comprises at least one of read, write, program, and erase.

* * * * *